United States Patent [19]

Baute

[11] Patent Number: 4,777,371

[45] Date of Patent: Oct. 11, 1988

[54] SUPPORT MATERIAL FOR ELECTRON BEAM SYSTEMS

[75] Inventor: Manfred Baute, Ebersberg, Fed. Rep. of Germany

[73] Assignee: Siemens Aktiengesellschaft, Berlin and Munich, Fed. Rep. of Germany

[21] Appl. No.: 857,215

[22] Filed: Apr. 29, 1986

[30] Foreign Application Priority Data

May 6, 1985 [DE] Fed. Rep. of Germany ....... 3516215

[51] Int. Cl.$^4$ .............................................. H01J 37/20
[52] U.S. Cl. .............................. 250/440.1; 250/442.1; 346/158; 219/121.31
[58] Field of Search .................... 250/442.1, 440.1; 346/158; 219/121 EX

[56] References Cited

U.S. PATENT DOCUMENTS 3,834,981  9/1974  Grossman et al. .................. 161/192

FOREIGN PATENT DOCUMENTS 3151228  7/1983  Fed. Rep. of Germany .
58-21327  2/1983  Japan .
60-37729  2/1985  Japan .

*Primary Examiner*—Carolyn E. Fields
*Assistant Examiner*—Jack I. Berman
*Attorney, Agent, or Firm*—John F. Moran

[57] ABSTRACT

Support elements for electron beam systems for semiconductor manufacture must be subject to at most minimal temperature influences, as they have important effects on the adjustment precision. The composition of such support elements from a glass ceramic with a crystalline phase with high quartz structure and with a residual vitreous phase permits extensive compensation of the thermal expansion of the two phases. The use of the glass ceramic for mask substrate, mask cassettes, receiving table with support arm, and mirror substrate reduces the time requirement as well as the error susceptibility in the temperature control of the system.

6 Claims, 1 Drawing Sheet

SUPPORT MATERIAL FOR ELECTRON BEAM SYSTEMS

BACKGROUND OF THE INVENTION

1. Technical Field

The present invention relates to the field of electronics manufacture and particularly to the use of glass ceramic support elements in electron beam imaging systems.

2. Description of the Prior Art

The dimensional accuracy of materials used in electron beam systems determines essentially the precision and reproducibility of the products to be treated or to be produced by means of these systems. Thus one tries to avoid temperature-related expansions of the support elements by a high-precision temperature regulation. However, since electron beam systems operate under vacuum conditions, it is difficult to observe, collect and process an ideally large amount of test data. Furthermore, the material and volume-dependent temperature capacities are difficult to take into consideration. For this reason the temperatures have hitherto been checked as far as was feasible and any possible expansions estimated into the calculations accordingly.

This procedure is very time-consuming and is moreover very susceptible to error because of high measurement tolerances of the temperature measuring systems.

SUMMARY OF THE INVENTION

It is the object of the present invention therefore to reduce the effects of temperature influences on electron beam imaging systems.

According to the invention, this problem is solved by the use of support elements comprising a composition of glass ceramic whose properties demonstrate a low coefficient of thermal expansion in the temperature ranges of interest.

Forming the basis of the invention is the ideal of replacing, if possible, all parts which due to temperature fluctuations affect the accuracy and reproducibility of electron beam systems with glass ceramic. Suitable for this replacement are essentially all the support elements of such systems such as the substrate for electron beam masks, the substrate supports for the masks, the receiving table or stage with its support arm, and the substrates for the adjusting mirrors of the receiving table. For each such support element, stringent requirements must be set regarding the mechanical and thermal properties, which according to the invention are fulfilled by a particular glass ceramic.

A glass ceramic is an inorganic material which contains crystalline phases besides vitreous components. Possible properties of a glass ceramic are evident from a bulletin on a glass ceramic of the firm Schott & Gen., Mainz, Germany which is registered under the trademark ZERODUR. Thus glass ceramics produced in this manner are homogeneous in volume and also with respect to their mechanical and thermal properties. They can be sawed, drilled, milled and ground and, similar to optical or technical glasses, polished.

The low temperature dependence of a glass ceramic to be used according to the invention is based on the fact that the crystalline phase has negative thermal expansion, while that of the glass phase is positive. The linear thermal expansion of the glass ceramic is thereby largely compensated as a whole. According to the invention, a glass ceramic with 70–75% crystalline phase with high quartz structure, having a mean crystalline size of 50 nm, and with a residual vitreous phase of 25–30 percent by weight is used. The mean coefficient of linear expansion of such a glass ceramic lies below $1.8 \times 10^{-7}/K$ in the temperature range of from $-160°$ to $+20°$ C., below $2.2 \times 10^{-7}/K$ in the temperature range of from $+20°$ to $+300°$ C. and, in the temperature range of from $0°$ to $+50°$ C., the mean coefficient of linear thermal expansion is as low as $\pm 1 \times 10^{-7}/K$, so that a normal operating temperature of $20°$ C. at most minimal temperature influences occur.

Additional physical, chemical and optical properties of a glass ceramic to be used according to the invention have parameters comparable with quartz or glass or better than either. Thus the longitudinal aging coefficient is below $1 \times 10^{-7}$ per year, a range of high transparence exists for wavelengths below 400 nm to above 2600 nm, and at normal temperature only hydrofluoric acid attacks the glass ceramic. Electrically the glass ceramic shows a high specific resistance combined with a low loss factor. Coating and detachment of metals during metallization present no problems.

The use, according to the invention, of such a glass ceramic for support elements in electron beam systems will be explained below with reference to some examples.

DETAILED DESCRIPTION

Figure 1:
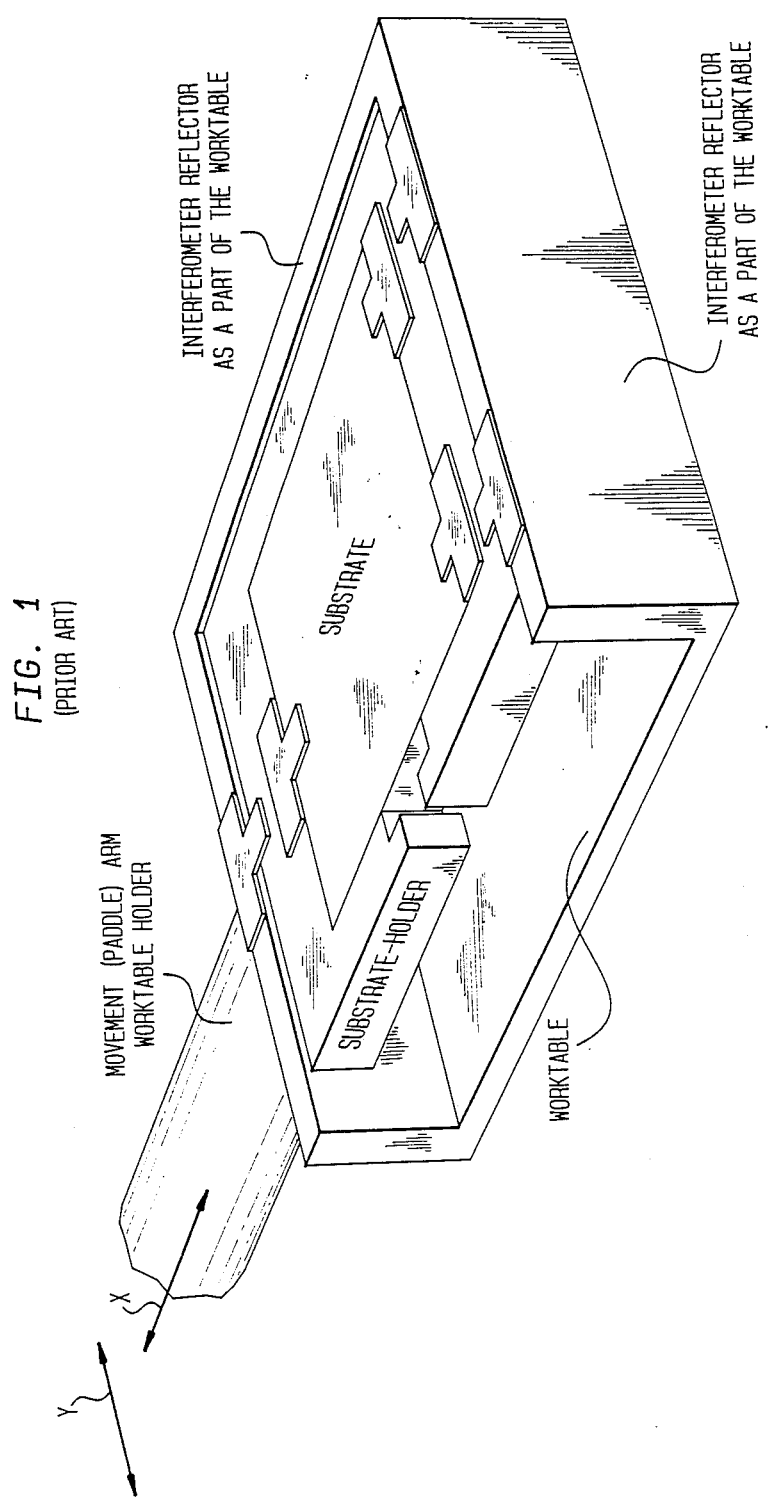
FIG. 1 shows a conventional support for an electron beam system.

In the first example, the glass ceramic is used according to the invention as an electronics assembly holding cassette inter alia with guide points and holding or shunting terminals. The resulting temperature influence on the expansion properties is substantially reduced as compared with aluminum which has frequently been used until now for the construction of such cassettes.

Further examples of a glass ceramic according to the invention concern the composition of "stages" of glass ceramic, that is, the receiving table of an electron beam recorder, such as that shown in FIG. 1, including polished mirrors for the laser interferometric measurement of the table position of the electron beam recorder. The receiving table and the substrate for the mirrors are vaporized with metal after mechanical treatment, the metal layer vaporized on the mirror substrate being polished and thus serving as the mirror. As another example, paddle arms, that is, the support arms for stages, may also comprise glass ceramic which after mechanical treatment is vaporized with metal. For the composition of stages and paddle arms, until now, beryllium has been used which, however, has inferrior temperature expansion properties.

The use according to the invention of glass ceramic as a material for the composition of stages, mirror substrate and paddle arms improves the previously very error-ridden and time-consuming procedure of the checking and subsequent figuring in of possible expansions, which was adversely influenced additionally by high measurement tolerances of the temperature measuring systems. With the use of glass ceramic for support elements in electron beam systems, on the contrary, the influence of temperature can largely be neglected.

I claim:

1. A support arrangement for electron beam systems, the support arrangement having essentially all stationary parts consisting of a material composition of glass ceramic with 70% to 75% by weight crystalline phase with high quartz structure, having a mean crystallite size of 50 nm, and with a residual vitreous phase of 25–30% by weight, with a mean linear expansion coefficient below $1.8 \times 10^{-7}$/K in the temperature range of from $-160°$ to $+20°$ C., under $2.2 \times 10^{-7}$/K in the temperature range of from $+20°$ to $+300°$ C., and under $1 \times 10^{-7}$/K in the temperature range of from $0°$ to $50°$ C.

2. A support arrangement for electron beam systems according to claim 1, wherein the support arrangement includes a receiving table of an electron beam recorder.

3. A support arrangement for electron beam systems according to claim 2, wherein the support arrangement includes a substrate for mirrors disposed at a receiving table of an electron beam recorder, the mirrors for laser inteferometric checking of the table position.

4. A support arrangement for electron beam systems according to claim 2, wherein the support arrangement includes a support arm of the receiving table of the electron beam recorder.

5. A substrate support arrangement for electron beam systems, the support having all stationary parts consisting of a material composition of glass ceramic with 70% to 75% by weight crystalline phase with high quartz structure, having a mean crystallite size of 50 nm, and with a residual vitreous phase of 25–30% by weight, with a mean linear expansion coefficient below $1.8 \times 10^{-7}$/K in the temperature range of from $-160°$ to $+20°$ C., under $2.2 \times 10^{-7}$/K in the temperature range of from $+20°$ to $+300°$ C., and under $1 \times 10^{-7}$/K in the temperature range of from $0°$ to $50°$ C.

6. A substrate for electron beam systems, the substrate having all stationary parts consisting of a material composition of glass ceramic with 70% to 75% by weight crystalline phase with high quartz structure, having a mean crystallite size of 50 nm, and with a residual vitreous phase of 25–30% by weight, with a mean linear expansion coefficient below $1.8 \times 10^{-7}$/K in the temperature range of from $-160°$ to $+20°$ C., under $2.2 \times 10^{-7}$/K in the temperature range of from $+20°$ to $+300°$ C., and under $1 \times 10^{-7}$/K in the temperature range of from $0°$ to $50°$ C.

* * * * *